United States Patent [19]
Fujii

[11] Patent Number: 4,803,713
[45] Date of Patent: Feb. 7, 1989

[54] X-RAY LIGHOGRAPHY SYSTEM USING SYNCHROTRON RADIATION

[75] Inventor: Kiyoshi Fujii, Tokyo, Japan

[73] Assignee: NEC Corporation, Tokyo, Japan

[21] Appl. No.: 116,816

[22] Filed: Nov. 5, 1987

[30] Foreign Application Priority Data

Nov. 5, 1986 [JP] Japan .............................. 61-261830

[51] Int. Cl.$^4$ .......................... G21K 5/00; G21K 5/10
[52] U.S. Cl. ........................................ 378/34; 378/35; 378/146
[58] Field of Search ...................... 378/34, 35, 146, 84

[56] References Cited

U.S. PATENT DOCUMENTS 4,516,254  5/1985  Komeyama et al. ................. 378/35
4,748,646  5/1988  Osada et al. ......................... 378/34

Primary Examiner—Carolyn E. Fields
Assistant Examiner—Joseph A. Hynds
Attorney, Agent, or Firm—Sughrue, Mion, Zinn, Macpeak & Seas

[57] ABSTRACT

An X-ray lithography system using synchrotron radiation including X-rays is disclosed. A mirror is provided in a beam line structure between the X-ray source and the X-ray mask in the X-ray lithography apparatus. The mirror is reciprocatingly moved in the same direction as that of the X-rays from the source, or in the normal direction to that of the X-rays.

4 Claims, 4 Drawing Sheets

X-RAY LIGHOGRAPHY SYSTEM USING SYNCHROTRON RADIATION

BACKGROUND OF THE INVENTION

The present invention relates to an X-ray lithography system using synchrotron radiation, and more particularly to the system having an improved mirror mechanism in the beam line.

The X-ray lithography system using synchrotron radiation including an x-ray beam having 4 to 20 Å wavelength, that is, a soft X-ray beam, comprises a beam line structure connected to a storage ring and an X-ray lithography exposure apparatus connected to the beam line. In the storage ring, electrons run along a curved locus and strong synchrotron radiation such as soft X-rays are produced. That is, the storage ring is used as an X-ray source. The X-rays emitted from the storage ring travel in the long beam line structure, and are introduced into the X-ray lithography exposure apparatus in which a wellknown X-ray lithography is conducted. The X-rays have a uniform intensity in the horizontal direction which is in parallel to the electron locus plane in the storage ring, however, it has a sharp intensity distribution in the vertical direction perpendicular tot he locus plane. More particularly, at the X-ray exposure apparatus which is separated about 5 to 10 m from the storage ring, the effective cross-sectional area of the X-rays become about 50 mm in the horizontal direction and about 5 mm in the vertical direction, for example. Therefore, a sufficient exposure area in the apparatus cannot be obtained in the vertical direction. To solve the problem, R. P. Haelbick et al. proposed in Journal of Vacuum Science and Technology, Vol. 1, No. 4, October–December, 1983, pp. 1262 to 1266, entitled "Design and performance of an X-ray lithography beam line at a storage ring" a new system in which a mirror is installed in the beam line structure between the storage ring and the exposure apparatus and rotates the mirror to scan the X-rays vertically on the mask in the exposure apparatus. However, in this case, a mask pattern of the mask cannot be precisely transferred to a resist film on a work piece, such as, a semiconductor wafer. That is, run-out errors are produced in peripheral portions of the exposure areas, of 20 mm×20 mm to 50 mm×50 mm.

SUMMARY OF THE INVENTION

Accordingly, an object of the present invention is to provide a X-ray lithography system which can realize a sufficiently large exposure area with a precise transferring from a mask pattern to a work piece in a X-ray lithography exposure apparatus.

According to one feature of the present invention, there is provided a X-ray lithography system using synchrotron radiation including an X-ray beam. The system comprises a beam line structure and an X-ray lithography exposure apparatus. The beam line structure includes a first line portion extending in a first direction, a second line portion extending in a second direction inclined from the first direction, a chamber connecting the first and second line portions, a mirror for reflecting the X-rays provided in the chamber, and a means for moving the mirror in the first direction with keeping a constant angle from the first direction. Whereby, X-rays travelling in the first direction within the first line portion are reflected by the mirror to the second direction and travell within the second line portion, and the X-rays within the second line portion can be scanned in a third direction perpendicular to the second direction in correspondence with the movement of the mirror in the first direction. The X-ray lithography exposure apparatus is positioned at the end of the second line portion of the beam line structure and includes an X-ray mask provided along the third direction such that the scanning X-rays irradiate perpendicularly to the surface of the mask in all exposure areas of the mask.

Another feature of the present invention is that an X-ray lithography system using synchrotron radiation including X-rays. The system comprises a beam line structure and an X-ray lithography exposure apparatus. The beam line structure includes a first line portion having a first axis extending in a first direction, a second line portion having a second axis extending in the first direction and located from the first axis in a second direction perpendicular to the first direction, a chamber connecting the first and second line portions, a first mirror provided in the chamber and facing the first line portion, a second mirror provided in the chamber and facing the second line portion, a first means for rotating the first mirror, a second means for rotating the second mirror, and third for moving the second mirror in the second direction. Whereby, the X-rays travelling in the first line portion are reflected by the first and second mirrors in sequence and travel in the second line portion and the X-rays in the second line portion are scanned in the second direction in correspondence with the movement of the first and second mirrors by the first to third means. The X-ray lithography exposure apparatus is connected to the second line portion of the beam line structure, and includes an X-ray mask provided along the second direction such that the scanning X-rays irradiate perpendicularly to the surface of the mask in all exposure areas of the mask.

The X-rays may be soft X-rays having the wavelength of 4 to 20 Å. The system may further comprises a window structure provided between the second line portion of the beam line structure and the X-ray lithography exposure apparatus. The window structure passes the X-rays and seals the beam line structure to keep the inner space of the structure in vacuum. In this case, the X-ray lithography exposure apparatus may be installed in atmospheric pressure, and therefore, the operation of the lithography in the apparatus can be easy and the throughput can be enhanced.

According to the present invention, the scanning X-rays are irradiated to the X-ray mask in perpendicular to the surface of the mask in all exposure areas, that is, in all length of the vertical direction. Therefore, the run-out error is never caused, and a precise transferring of the pattern from the X-ray mask to the resist film can be realized without compensating the X-ray mask for the run-out error.

DESCRIPTION OF THE PRIOR ART

Figure 1:
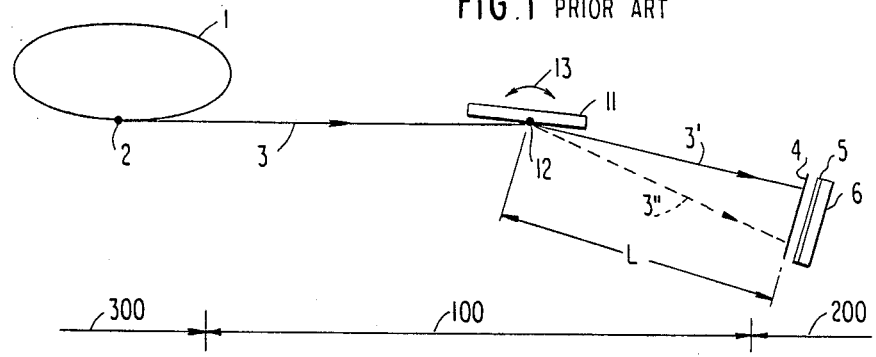
FIG. 1 is a schematic view showing a principle of an X-ray lithography system of a prior art.
Figure 3:
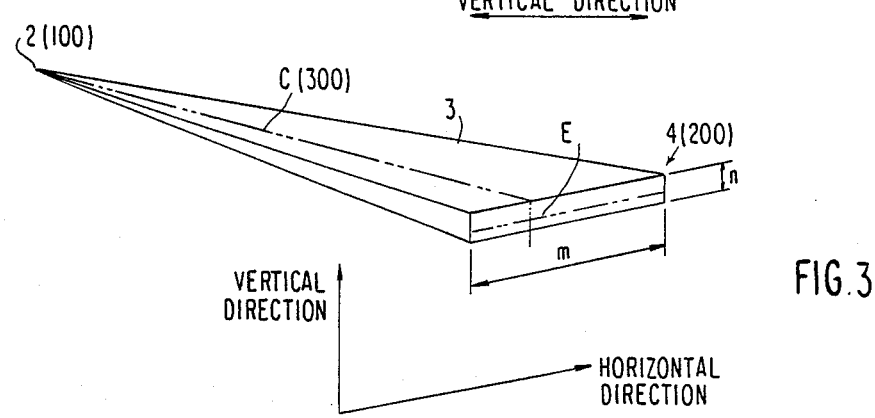
FIG. 3 is a perspective view showing an X-ray beam from a storage ring to an X-ray exposure apparatus.

Referring to FIG. 1, electrons 1 run along a curved locus in a storage ring 300, and from a point 2, an X-ray beam 3 emits in the tangent direction of the locus into a beam line structure 100. The X-ray beam 3 travels in the beam line structure 100 having a long distance of 5 m to 10 m, and irradiates on an X-ray mask in an X-ray lithography exposure apparatus 200 to transfer an image of a pattern on the x-ray mask 4 to a resist film 5 on a work piece such as a semiconductor wafer 6. As shown in FIG. 3, the X-ray beam 3 from the point 2 of the storage ring 100 is enlarged in the beam line structure 300 and keeps a rectangular cross-sectional shape. At the mask 4 or the exposure apparatus 200, its shape has the horizontal length m of, for example, 50 mm and the vertical length n of, for example, 5 mm. Generally, one exposure area of the mask 4 is 20 mm square to 50 mm square. Therefore, in the horizontal direction, the X-ray beam length m meets the exposure area of the mask. However, in the vertical direction, the length n of the X-ray beam 3 is lacking in the necessary length of the exposure area. Returning to FIG. 1, to solve the problem mentioned above, a mirror 11 is installed between the X-ray source portion 2 and the X-ray mask 4, that is, in the beam line structure 100, and the mirror 11 is rotated at a predetermined angle around a fixed axis 12 as represented by an arrow 13. Therefore, the X-ray beam scans between one side state 3' and the other side state 3" in the vertical direction in FIG. 3 so that the full length of the exposure area of the mask in the vertical direction can be exposed by the X-ray beam. However, the method cannot be expected to produce a precise lithography.

Figure 2:
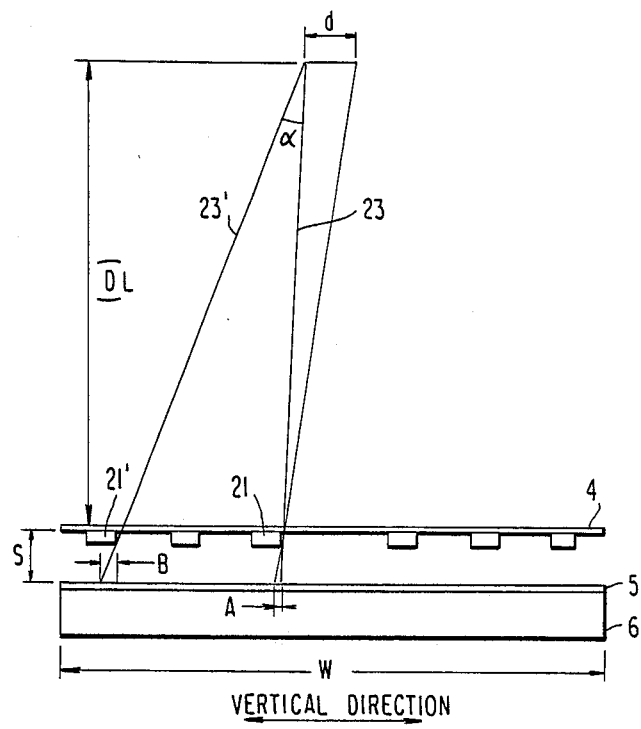
FIG. 2 is a schematic view showing a condition of transferring an image of a pattern on a mask to a resist film on a semiconductor wafer in the prior art.

Referring to FIG. 2, a principle of the X-ray exposure will be explained.

It is to be noted that the X-ray beam shown in FIG. 2 represents an arbitrary part E within the length n and the formation thereof in cross-sectional view of a line C, in FIG. 3; not represents a whole length n in the vertical direction of the X-ray beam.

The geometrical problems in the X-ray exposure are penumbral blurring A, run-out error B and error ΔB caused by gap error ΔS, and respective values are represented by following formulas; $A = S(d/D)$, $B = S(W/2D)$, $\Delta B = \Delta S(W/2D)$. The symbol d denotes a diameter of the X-rays at the source portion 2 of the storage ring and be about 1 mm or less; the symbol D denotes the distance between the source portion 2 and the X-ray mask 4 and be 5 to 10 m; the symbol W denotes the length of the exposure area in the vertical direction and be 20 to 50 mm; and the symbol S denotes the gap between the X-ray mask 4 and the resist film 5 on the semiconductor wafer 6 and be 20 to 40 μm. Therefore, the penumbral blurring A and the error ΔB by gap error ΔS become 0.001 μm or less, and therefore they can be negligible. However, the run-out error B becomes 0.025 to 0.2 μm, and therefore it can not be neglected. When the X-ray beam 23 is substantially perpendicular to the mask 4 and transfer the image of the pattern 21 to the resist film 5, no run-out error is caused. However, if an X-ray beam is irradiated in an inclined condition by an angle α as the X-ray beam 23' in FIG. 2, the run-out error B is caused at the peripheral portion of the exposure area where a pattern 21' of the mask 4 is transferred to the resist film 5. Therefore, the method of FIG. 1, in which the mirror 11 is rotated to incline the X-ray beam and thereby scanning the X-ray beam, causes the run-out error B inevitably. Further, in the system shown in FIG. 1, the distance L between the mirror 11 and the X-ray mask 4 must be used to calculate the run-out error B in replace of using the distance D. That is, the B is calculated by $B = S(W/2L)$. For example, when the distance L is 2 m; the gap S is 25 μm; and the length W of the exposure area is 50 mm; the run-out error B becomes a large value of 0.31 μm in the vertical direction. Therefore, a mask pattern must be modified beforehand to compensate the run-out error. It is a complicated and unpractical work.

DESCRIPTION OF EMBODIMENTS

First Embodiment

Figure 4:
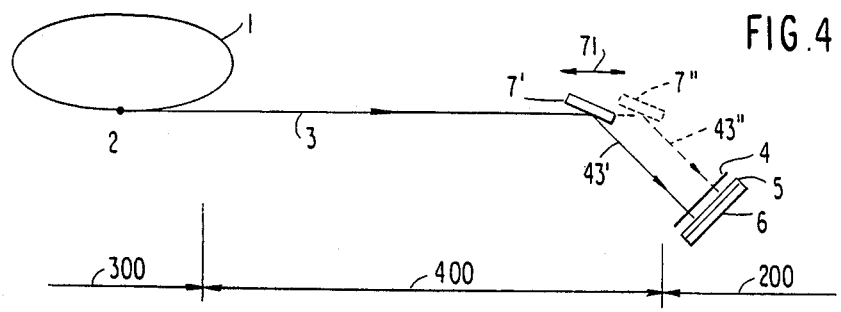
FIG. 4 is a schematic view showing a principle of an X-ray lithography system according to a first embodiment of the present invention.
Figure 5:
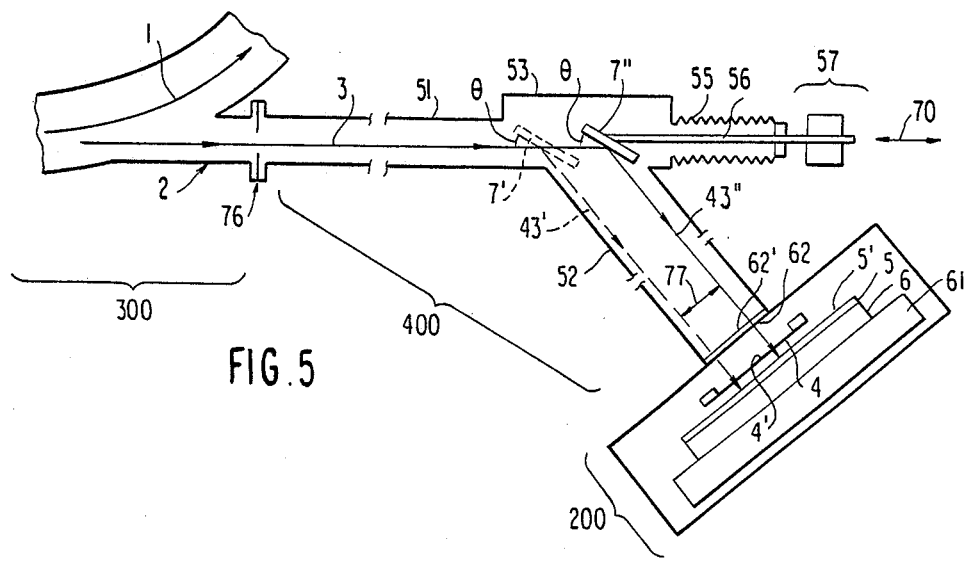
FIG. 5 is a schematic cross-sectional view showing the first embodiment of the invention.
Figure 6:
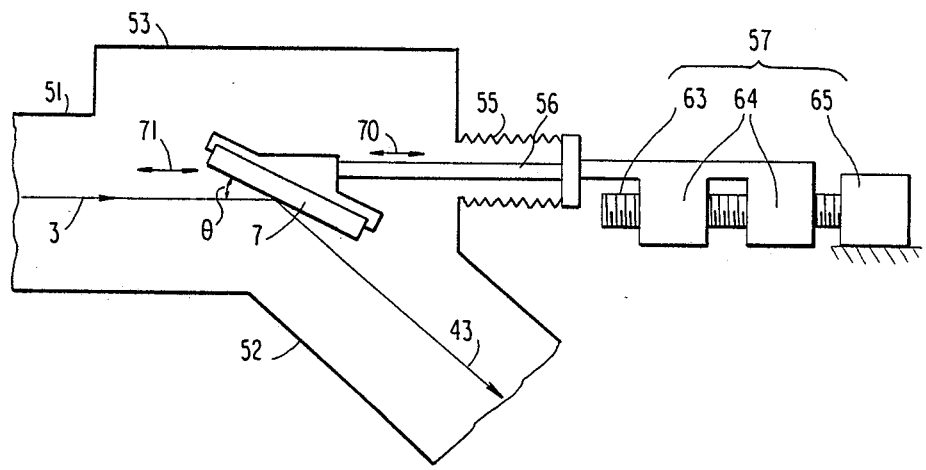
FIG. 6 is a enlarged cross-sectional view showing a part of FIG. 5.

Referring to FIGS. 4 to 7, the same components as those in FIGS. 1 to 3 are indicated by the same reference numerals. Also, it is to be noted that only the vertical direction of the X-ray beam in FIG. 3 is shown in FIGS. 4 to 6 by solid or chain lines. With respect to FIG. 7, the triangular shape is of one line E within the vertical direction of the X-ray beam in FIG. 3, that is, FIG. 7 corresponds to FIG. 2. And, the horizontal direction of the X-ray beam in FIG. 3 is the direction normal to the surface of the sheets of FIGS. 4 to 7, respectively.

Figure 7:
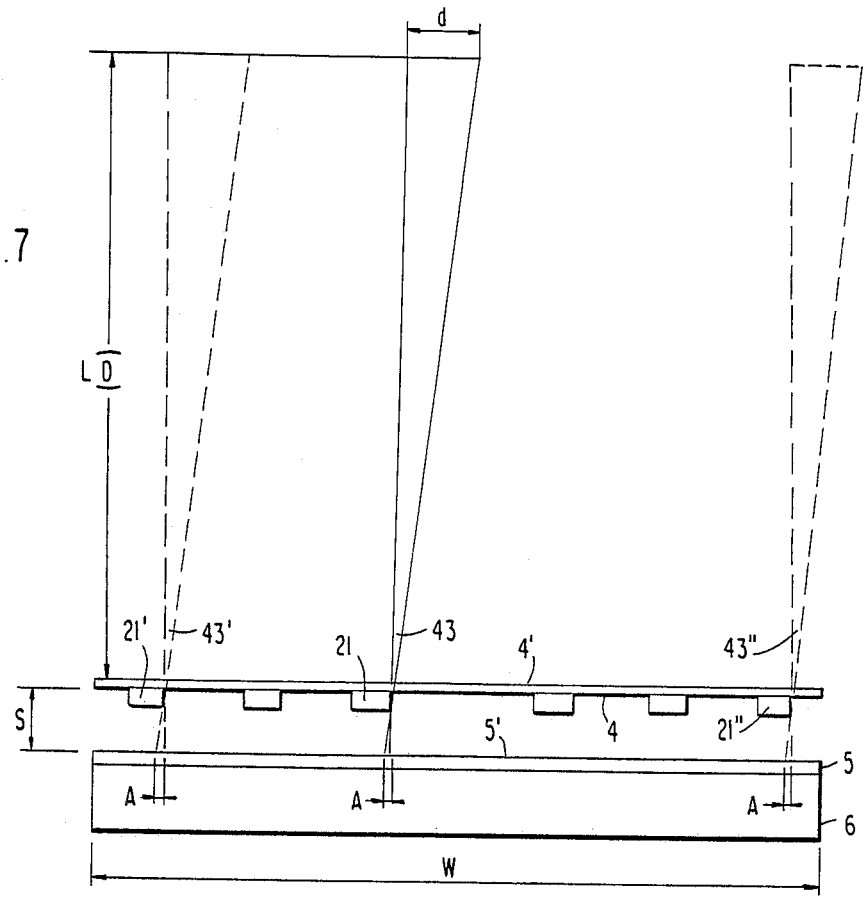
FIG. 7 is a schematic view showing a condition of transferring an image of a pattern on a mask to a resist film on a semiconductor wafer in the first embodiment.

A beam line structure 400 includes a first line portion 51 extending at 2 m, for example, in a first direction and connected to the storage ring 300 at a connecting part 76, a second line portion 52 extending at 3 m, for example, in a second direction inclined from the first direction and a chamber 53 connecting the first and second line portions. The first and second line portions and the chamber may be continuously formed. A bellows 55 is connected to the side wall of the chamber and through which a support bar 56 is inserted into the chamber. The support bar 56 fixes a mirror 7 at one end side and at the other end side, outside of the bellows 55, the support bar 56 is coupled to a drive means 57. The drive means 57 has a motor 65, a male screw bolt 63, a female screw frange 64 coupled to the bolt 63 and connecting to the support bar 56, rack (not shown), pinion (not shown) if necessary. The motor 65 may be a linear motor. In any case, the drive means 57 moves the support bar 56 reciprocatingly in the first direction as represented by arrow 70, and also moves the mirror 7 reciprocatingly in the first direction as represented by arrow 71 with keeping the fixed angle 0 from the first direction such that the mirror 7 scans between the mirror state 7' and the mirror state 7". On the other hand, the X-ray lithography exposure apparatus 200 is positioned at the end of the second line portion 52 of the beam line structure 400 and contacted to the end through a window structure 62 including a beryllium (Be) window 62'. The apparatus 200 includes an X-Y stage 61 on which the semiconductor wafer 6 is provided and the X-ray mask 4. The apparatus 200 is installed in atmosphere. On the other hand, the beam line structure 400 is sealed by the window structure 62 and the inner space of the beam line structure keeps vacuum state in the operation. The X-ray beam 3 travelling within the first line portion 51 from the storage ring 300 is reflected by the mirror 7 to the second direction, and travels within the second line portion 52 in the second direction. The X-ray beam within the second line portion is represented by numeral 43. When the mirror 7 is scanned between state 7' and state 7'', the X-ray beam 43 in the second line portion 52 is also scanned between the state 43' and state 43'' in a third direction perpendicular to the second direction as represented by arrow 77. Therefore, in every state, the X-ray beam can irradiate perpendicularly to the surface 4' of the mask 4 and the surface 8' of the resist film 5 through the window 62'. More particularly as shown in FIG. 7, in all exposure areas, that is, in all length W of the area, any run-out error B in FIG. 2 is never caused. Because, the scanned X-ray beam at the peripheral states 43', 43'' as well as the center state 43 irradiates perpendicularly to the surface 4' of the mask 4 and to the surface 5' of the resist film 5. One exposure area is defined by mask manufacturing technology and in the present time it ranges from 20 mm square to 50 mm square, and a well-known step and repeat method is conducted in an X-ray lithography. In each of FIGS. 2 and 7, only one exposure area in the semiconductor wafer 6 is disclosed, and in each of the other drawings, only one exposure area and the vicinity thereof in the semiconductor wafer 6 is disclosed.

Now, in the first embodiment, the mirror 7 has the surface area of 40 mm×60 mm and the thickness of 10 mm, and made of a glass or quartz substrate and a gold or platinum coating surface film. The mirror may be made of a silicon substrate and a layer on the substrate of a tungsten film and a beryllium film alternatively laminated.

When the resist film 5 is a positive resist film having the sensitivity of 50 m Joule/cm$^2$, and the X-ray beam intensity on the film is about 20 m watt. The exposure time becomes 2.5 second. On the other hand, when the exposure area is 25 mm×25 mm, that is, the vertical length W is 25 mm, and the glacing angle $\theta$ of the mirror is 10°, the stroke length 71 of the mirror becomes 73 mm (25 mm/sin (2×10°)). If the stroke length is set to 90 mm, and the exposure is conducted by one scanning of the mirrow, the mirror speed becomes 36 mm/sec.

Second Embodiment

Figure 8:
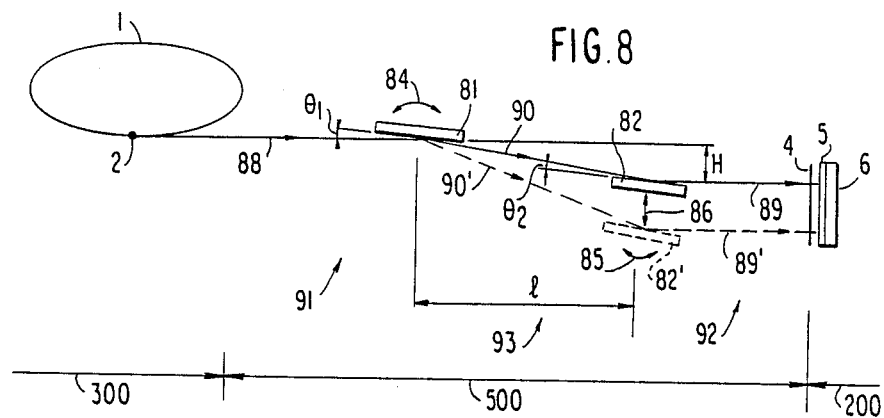
FIG. 8 is a schematic view showing a principle of an X-ray lithography system according to a second embodiment of the present invention.
Figure 9:
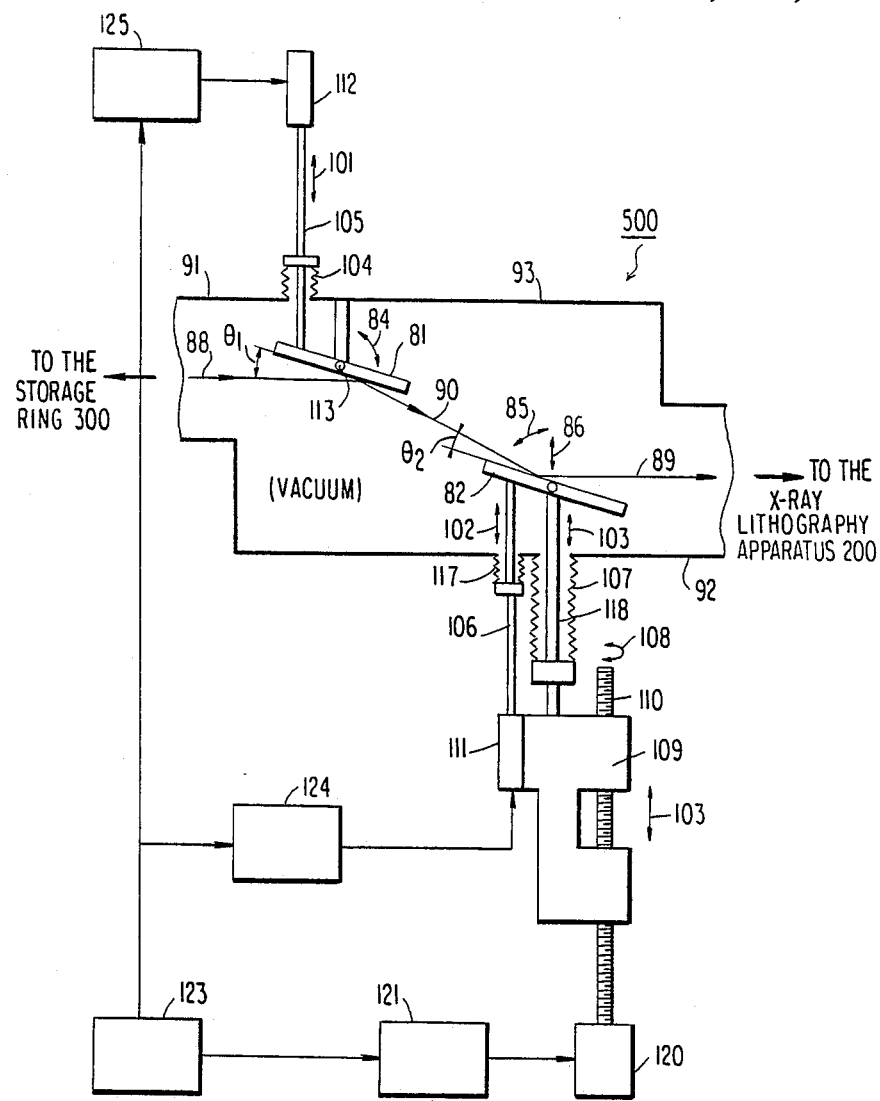
FIG. 9 is a cross-sectional view including a block diagram showing a mirror mechanism of the second embodiment of the invention.

Referring to FIGS. 8 and 9, the same components as those in FIGS. 4 to 7 are indicated by the same reference numerals. Also, the vertical direction of the X-ray beam in FIG. 3 is only shown in FIGS. 8 and 9 by solid or chain lines. The horizontal direction thereof is the direction normal to the surface of the sheets of FIGS. 8 and 9, respectively.

A beam line structure 500 includes a first line portion 91 extending in a first direction from the storage ring 300, a second line portion 92 extending in the first direction to the X-ray lithography exposure apparatus 200. The first and second line portions extend in the same direction, but their axes are located each other as apparently in FIGS. 8 and 9. A chamber 93 is provided between the first and second line portions and connects these positions. In FIG. 9, only parts of the first and second line portions 91, 92 connected to the chamber 93 are disclosed. However, the first and second line portions 91 and 92 just entend to the storage ring 300 and the X-ray lithography apparatus 200, respectively. A first mirror 81 is provided in the chamber 93 and faces to the first line portion 91, and a second mirror 82 is provided in the chamber 93 and faces to the second line portion 92. The X-ray beam 88 traveling within the first line portion 91 along the first direction is reflected by the first mirror 81 to an inclined direction. The reflected X-ray beam is represented by an numeral 90. The inclined X-ray beam 90 is again reflected by the second mirror 82 to the first direction and travels within the second line portion 92 along the first direction to the apparatus where the X-ray beam 89 is irradiated to the mask 4 and the resist film 5 perpendicularly to the surfaces of mask and film. The first mirror 81 rotates around the axis 113 as represented by an arrow 84, that is, the angle $\theta_1$ between the first direction and the first mirror 81 is changed. Therefore, the inclined X-ray beam 90 is scanned between a state 90 (solid line) and a state 90' (chain line). On the other hand, the second mirror 82 is moved its angle and position in correspondence to the change of angle $\theta_1$ of the first mirror. More particularly, the second mirror 82 rotates arround the axis 123 as represented by an arrow 85, that is, the angle $\theta_2$ between the inclined X-ray beam and the second mirror is changed, and the second mirror 82 moves perpendicularly to the first direction as represented by an arrow 86, such that the X-ray beam 89 within the second line portion 92 is scanned between the state 89 (solid line) and the state 89' (chain line) by keeping in parallel each other within the exposure area. That is, the X-ray beam 89 is scanned with keeping the normal irradiation to the mask in all the expose area. It is to be noted that the angle $\theta_1$ and the angle $\theta_2$ must keep the same value in all states. And, the height H between the X-ray beam 88 position within the first line portion 91 which is constant and the position of the second mirror 82 must keep a following formula.

H=$\lambda$ tan 2$\theta_1$, where $\lambda$ is the distance between the axis 113 of the first mirror 81 and the axis 123 of the second mirror 82.

That is, the second mirror 82 must be moved its height (H) and angle ($\theta_2$) in correspondence to the change of the angle $\theta_1$ of the first mirror 81 such that $\theta_2$ equals to $\theta_1$ and H equals to $\lambda \times$ tan 2$\theta_1$.

The example of the drive mechanism for the first and second mirrors will be explained by referring FIG. 9. The first mirror 81 is supported by the axis 113, and a bellows 104 is provided at the wall of the chamber 93 through which a bar 105 is installed from atmospheric outside into vacuum inside. The bar 105 is coupled to the first mirror 81 at its one end and at its other end to a piezo actuator 112 which is driven by a piezo driver 125. By the piezo actuator 112, the bar 105 is moved reciprocatingly as represented by an arrow 101, and the first mirror 81 is rotated to change the angle $\theta_1$. On the other hand, bellows 107 and 117 are provided at the wall of the chamber 93, and the second mirror 82 is supported at an end of a bar 118 which is installed from atmospheric outside into vacuum inside through the bellows 107. The bar 118 is coupled at its the other end to a member 109 in which a female screw is penetrated. A male screw bolt 110 is coupled to the female screw of the member 109 and drived by a pulse motor 120. By rotating the screw 110 as represented by an arrow 108, the bar 118 and the member 109 are moved reciprocatingly as represented by arrows 103, and the second mirror 82 is also performed the reciprocating movement as represented by the arrow 86. The pulse motor 120 may be a linear motor; in this case, the bolt screw construction may be changed to an adequate mechanism. A bar 106 is installed through the bellows 117 from atmospheric outside into vacuum inside. The bar 106 is coupled to the second mirror 82 at its one end side and at its the other end side to a piezo actuator 111 which is fixed to the member 109 and driven by a piezo driver 124. By the piezo actuator 111, the bar 106 is moved reciprocatingly as represented by an arrow 102, and the second mirror 82 is rotated to change the angle $\theta_2$. The piezo drivers 124, 125 are operated by signals from a CPU 123, and the pulse motor is operated by pulses from a pulse generator 121 to which a necessary signal is transmitted from the CPU.

What is claimed is:

1. An X-ray lithography system using synchrotron radiation including X-rays, said system comprising a beam line structure and an X-ray lithography exposure apparatus, said beam line structure including a first line portion extending in a first direction, a second line portion extending in a second direction inclined from said first direction, a chamber connecting said first and second line portions, a mirror for reflecting said X-rays provided in said chamber, and a means for moving said mirror in said first direction while keeping a constant angle from said first direction, whereby X-rays travelling in said first direction within said first line portion are reflected by said mirror to said second direction and travel within said second line portion and said X-rays within said second line portion can be scanned in a third direction perpendicular to said second direction in correspondence with the movement of said mirror in said first direction by said means, and said X-ray lithography exposure apparatus being positioned at the end of said second line portion of said beam line structure and including an X-ray mask provided along said third direction such that said scanning X-rays irradiate perpendicularly to the surface of said mask in all exposure areas of said mask.

2. An X-ray lithography system of claim 1 further comprising a window structure provided between said second line portion of said beam line structure and said X-ray lithography exposure apparatus, said window structure passing said X-rays and sealing said beam line structure to keep the inner space of said structure in vacuum.

3. An X-ray lithography system of claim 2, in which said X-ray lithography exposure apparatus is installed in atmospheric pressure.

4. An X-ray lithography system using synchrotron radiation including X-rays, said system comprising a beam line structure and an X-ray lithography exposure apparatus, said beam line structure including a first line portion having a first axis extending in a first direction, a second line portion having a second axis extending in said first direction, said second axis being located from said first axis in a second direction perpendicular to said first direction, a chamber connecting said first and second line portions, a first mirror provided in said chamber and facing to said first line portion, a second mirror provided in said chamber and facing to said second line portion, a first means for rotating said first mirror, a second means for rotating said second mirror, and third means for moving said second mirror in said second direction, whereby X-rays travelling in said first line portion are reflected by said first and second mirrors in sequence and travel in said second line portion and said X-rays in said second line portion are scanned in said second direction in correspondence with the movement of said first and second mirrors by said first to third means, and said X-ray lithography exposure apparatus being connected to said second line portion of said beam line structure, and including an X-ray mask provided along said second direction such that said scanning X-rays irradiate perpendicularly to the surface of said mask in all exposure areas of said mask.

* * * * *

UNITED STATES PATENT AND TRADEMARK OFFICE
CERTIFICATE OF CORRECTION

PATENT NO. : 4,803,713
DATED : February 7, 1989
INVENTOR(S) : KIYOSHI FUJII

It is certified that error appears in the above-identified patent and that said Letters Patent is hereby corrected as shown below:

COLUMN 1, LINE 21, Delete "wellknown" and insert --well known--

COLUMN 1, LINE 26 Delete "tot he" and insert --to the--

COLUMN 6, LINE 43 Delete "$H = \lambda$" and insert --$H = \ell$--

COLUMN 6, LINE 43 Delete "where $\lambda$" and insert --where $\ell$ --

UNITED STATES PATENT AND TRADEMARK OFFICE
CERTIFICATE OF CORRECTION

PATENT NO. : 4,803,713

DATED : February 7, 1989

INVENTOR(S) : Kiyoshi Fujii

It is certified that error appears in the above-identified patent and that said Letters Patent is hereby corrected as shown below:

COLUMN 6, LINE 49    Delete "$\lambda x$" and insert --$\ell x$--

Signed and Sealed this

Twenty-fifth Day of July, 1989

Attest:

DONALD J. QUIGG

Attesting Officer    Commissioner of Patents and Trademarks